US006780667B2

United States Patent
Iizima et al.

(10) Patent No.: US 6,780,667 B2
(45) Date of Patent: Aug. 24, 2004

(54) SOLID-STATE IMAGE PICKUP APPARATUS AND FABRICATING METHOD THEREOF

(75) Inventors: Toshimichi Iizima, Nagano-ken (JP); Toyokazu Mizoguchi, Nagano-ken (JP); Kenji Miyata, Okaya (JP)

(73) Assignee: Olympus Optical, Co., Ltd., Tokyo (JP)

( * ) Notice: Subject to any disclaimer, the term of this patent is extended or adjusted under 35 U.S.C. 154(b) by 0 days.

(21) Appl. No.: 10/158,111

(22) Filed: May 31, 2002

(65) Prior Publication Data

US 2002/0149075 A1 Oct. 17, 2002

Related U.S. Application Data

(62) Division of application No. 09/800,516, filed on Mar. 8, 2001, now Pat. No. 6,483,179.

(30) Foreign Application Priority Data

Mar. 10, 2000  (JP) .......................................... 2000-66214

(51) Int. Cl.[7] .............................................. H01L 21/00
(52) U.S. Cl. ........................... 438/64; 438/68; 438/113; 438/114; 438/116
(58) Field of Search .............................. 438/64, 65, 66, 438/68, 113, 114, 115

(56) References Cited

U.S. PATENT DOCUMENTS

| 5,145,889 A | 9/1992 | Wada et al. ................. 523/451 |
| 5,998,862 A | 12/1999 | Yamanaka ................... 257/704 |

FOREIGN PATENT DOCUMENTS

JP  7-202152  8/1995

Primary Examiner—Tom Thomas
Assistant Examiner—N. Drew Richards
(74) Attorney, Agent, or Firm—Westerman, Hattori, Daniels & Adrian, LLP

(57) ABSTRACT

A solid-state image pickup apparatus having hermetic seal portion capable of packaged in a smaller size by a simple construction and fabricated with high precision at wafer level is constructed such that an epoxy-type resin sheet having opening portion only at light-receiving portion is adhered to solid-state image pickup device chip by an adhesive and a transparent member capable of becoming a flat-plate portion is adhered onto the epoxy-type resin sheet by means of an adhesive.

2 Claims, 4 Drawing Sheets

SOLID-STATE IMAGE PICKUP APPARATUS AND FABRICATING METHOD THEREOF

This application is a division of prior application Ser. No. 09/800,516 filed Mar. 8, 2001 now U.S. Pat. No. 6,483,179.

This application claims benefit of Japanese Application No. 2000-66214 filed in Japan on Mar. 10, 2000, the contents of which are incorporated this reference.

BACKGROUND OF THE INVENTION

The present invention relates to solid-state image pickup apparatus and fabricating method thereof having a solid-state image pickup device chip packaged in a hermetic seal.

A conventional solid-state image pickup apparatus having light receiving sensor chips such as a solid-state image pickup device chip in a hermetically sealed package is generally constructed as shown in FIG. 1. In particular, a solid-state image pickup device chip 101 is die-bonded to a package 102 for example of ceramics and a bonding wire 103 is used to achieve predetermined electrical connections between the solid-state image pickup device chip 101 and package 102. A space from the surface of the device chip 101 is provided by using step 104 formed at edge portions of package 102 and a hermetic seal is achieved by adhering a glass lid 105 thereto to construct the solid-state image pickup apparatus. It should be noted that numeral 106 in FIG. 1 denotes an external lead.

In solid-state image pickup apparatus having such construction, use of package 102 and glass lid 105 for hermetically sealing the entire solid-state image pickup device chip resulted in an increased packaging size and thus had been difficult to be applied to the fields where smaller package size was required.

To eliminate such disadvantage, the present applicant had proposed solid-state image pickup apparatus constructed as disclosed in Japanese patent laid-open application Hei-7-202152. A sectional view of such solid-state image pickup apparatus is shown in FIGS. 2 and 3. In FIG. 2, only the light-receiving area on the solid-state image pickup device chip 101 is hermetically sealed by means of a sealing member which includes a flat-plate portion 107 made of a transparent member and a frame portion 108 integrally formed therewith at a lower surface edge thereof. Glass, quartz, sapphire, transparent resin or the like is used as the transparent member for constituting the flat-plate portion 107. In the solid-state image pickup apparatus shown in FIG. 3, on the other hand, instead of integrally forming a hermetic seal portion, a flat-plate portion 109 and a frame portion 110 are adhered to each other to constitute the hermetic seal portion. Here frame portion 110 may be constituted by such inorganic materials as ceramics, glass, silicon or such metal as Kovar or 42-alloy. Further, it is also possible that an epoxy, phenol, or silicone resin may be printed or pattern-formed by photolithography on the surface of the solid-state image pickup device chip 101 to form the frame portion 110.

By constructing solid-state image pickup apparatus in this manner, a smaller size packaging thereof is possible and, especially in a solid-state image pickup apparatus having a micro-lens, the solid-state image pickup apparatus can be achieved without degrading the light converging capability of the micro-lens even when such optical components as a filter, lens, prism, etc., is adhered to the surface of the hermetic seal portion. Further, fabrication method has also become simpler, since hermetic seal portions can be formed at once for all of a large number of solid-state image pickup device chips in a wafer.

The previously proposed solid-state image pickup apparatus as described above, however, has the following problems to be solved. First, the structure of the integrally formed, hermetic seal portion as shown in FIG. 2 requires an integral forming of the hermetic seal portion having a flat-plate portion and a frame portion by using such transparent material as glass. Precision in processing is thus required and difficulties such as an increased the amount of work in fabrication are foreseen.

Further, the method of constructing the hermetic seal portion by adhering flat-plate portion and frame portion to each other as shown in FIG. 3, especially the method of constructing the frame portion by means of a pattern forming of resin, requires the processing steps of forming a resinous pattern, i.e., application of the resin onto a wafer, printing or photolithography, developing and etching. There is thus a problem that the number of processing steps is increased.

Furthermore, a more serious problem presumably occurs with this technique when the solid-state image pickup apparatus has a micro-lens. This is because a micro-lens, usually, is formed also from a resin. For example, after applying a resin over the entire surface of a wafer, the processing steps of patterning and etching of the frame portion must be performed before the resin cures. If etching is performed before the curing of the resin, however, the resin capable of becoming the frame portion is also etched away similarly as the portion of resin to be removed and there is a possibility that a sufficient frame is not formed. If etched after the curing of the resin, on the other hand, though a desired shape for the frame is formed, there is a possibility that the micro-lens is etched away at the same time of the etching of the unnecessary portion of resin to be removed due to the fact that the micro-lens is also made of a resin.

As the above, those previously proposed are with problems in the fabrication method or the reliability of hermetic seal portion, even though smaller size packaging is possible and hermetic seal portions can be formed at once for all chips in a wafer.

SUMMARY OF THE INVENTION

To eliminate the above problems, it is a main object of the present invention to provide a solid-state image pickup apparatus which can be packaged in a relatively small size and at the same time has a simple construction and a reliable hermetic seal portion.

In accordance with the invention, there is provided a solid-state image pickup apparatus fundamentally including: a solid-state image pickup device chip; and a hermetic seal portion provided over the solid-state image pickup device chip having a flat-plate portion formed of a transparent member and a frame portion adhered to a lower surface edge portion of the flat-plate portion, the frame portion of the hermetic seal portion comprising an epoxy-type resin sheet.

By constructing as the above, the solid-state image pickup apparatus can be achieved by a simple construction capable of downsizing at the same time of having a highly reliable hermetic seal portion. The above main object is thereby accomplished.

It is another object of the invention to provide a solid-state image pickup apparatus having a hermetic seal portion based on a simpler construction not requiring an adhesive.

In a further aspect of the invention, the epoxy-type resin sheet of the frame portion of the hermetic seal portion of the solid-state image pickup apparatus of the above fundamental construction has an adhesive property.

By constructing as the above, an adhesive becomes unnecessary in the forming of hermetic seal portion so that the hermetic seal portion can be made easily using a simple construction. The above object is thereby accomplished.

It is yet another object of the invention to provide a solid-state image pickup apparatus in which shielding of unwanted rays of light at solid-state image pickup device can be effected without providing a separate member for shielding light.

In a further aspect of the invention, the epoxy-type resin sheet of the frame portion of the hermetic seal portion of the solid-state image pickup apparatus of the above fundamental construction has a function of shielding light based on coloring or the like.

By constructing as the above, the frame portion of hermetic seal portion is capable of shielding unwanted rays of light so that adverse effects due to stray light or reflection on solid-state image pickup device chip can be prevented without providing a separate member for shielding light. The above object is thereby accomplished.

It is still another object of the invention to provide an optimum electrical connection structure between solid-state image pickup device chip and an external terminal in solid-state image pickup apparatus having a hermetic seal portion.

In a further aspect of the invention, the solid-state image pickup apparatus of the above fundamental construction has a wiring region formed from an electrode pad provided on the solid-state image pickup device chip to a side surface or from the electrode pad to a reverse surface of the solid-state image pickup device chip through the side surface so that an external terminal can be electrically connected to the wiring region.

By constructing as the above, an optimum electrical connection structure can be achieved between the solid-state image pickup device chip and the external terminal. The above object is thereby accomplished.

It is another object of the invention to provide fabricating method of solid-state image pickup apparatus capable of readily forming a hermetic seal portion with high registration accuracy on solid-state image pickup device chip.

In accordance with a further aspect of the invention, a fabricating method of solid-state image pickup apparatus including a solid-state image pickup device chip and a hermetic seal portion provided over the solid-state image pickup device chip having a flat-plate portion formed of a transparent member and a frame portion adhered to a lower surface edge portion of the flat-plate portion includes the steps of: for an entire wafer having a large number of solid-state image pickup device chips formed thereon, integrally forming hermetic seal portion having a flat-plate portion made of a transparent member and a frame portion formed of an epoxy-type resin sheet adhered to a lower surface edge portion of the flat-plate portion correspondingly to respective solid-state image pickup device chips; separating the wafer having the integrally formed hermetic seal portion thereon into solid-state image pickup device chips each having an individual hermetic seal portion.

By using such processing steps, hermetic seal portions can be formed at once on respective solid-state image pickup device chips in a wafer. Accordingly, it becomes possible to readily fabricate a solid-state image pickup apparatus having a hermetic seal portion precisely over solid-state image pickup device chip.

DESCRIPTION OF THE PREFERRED EMBODIMENTS

Figure 1:
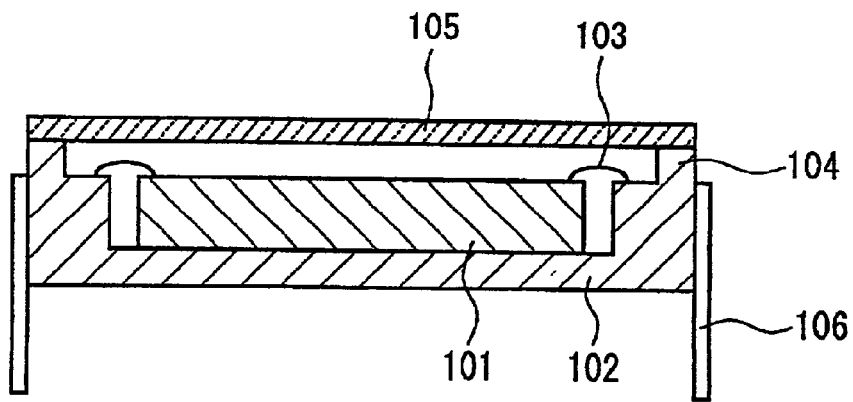
FIG. 1 shows an example of solid-state image pickup apparatus packaged with a conventional hermetic seal.
Figure 2:
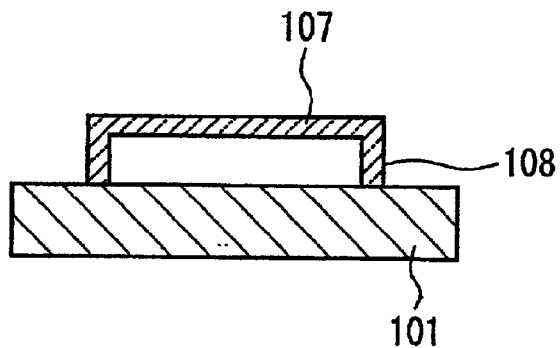
FIG. 2 shows construction of solid-state image pickup apparatus having a hermetic seal portion previously proposed by the present applicant.
Figure 3:
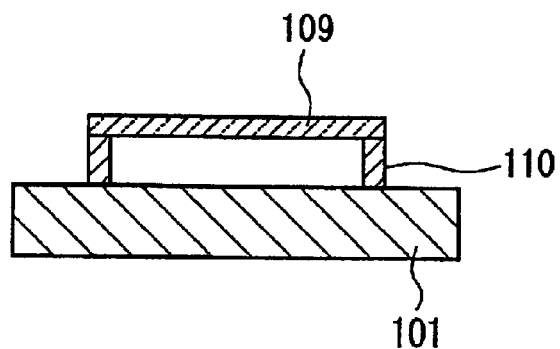
FIG. 3 shows another construction of solid-state image pickup apparatus having a hermetic seal portion previously proposed by the present applicant.
Figure 4:
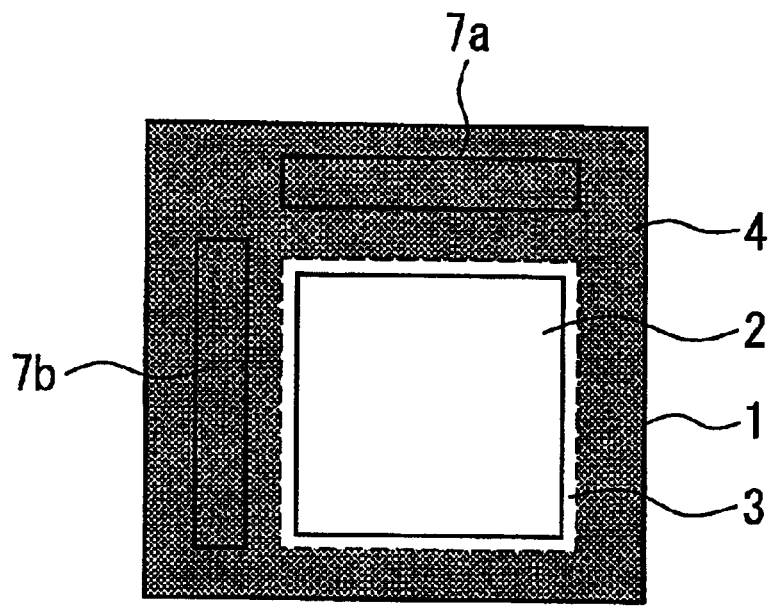
FIG. 4 is a top view showing an embodiment of solid-state image pickup apparatus according to the invention.
Figure 5:
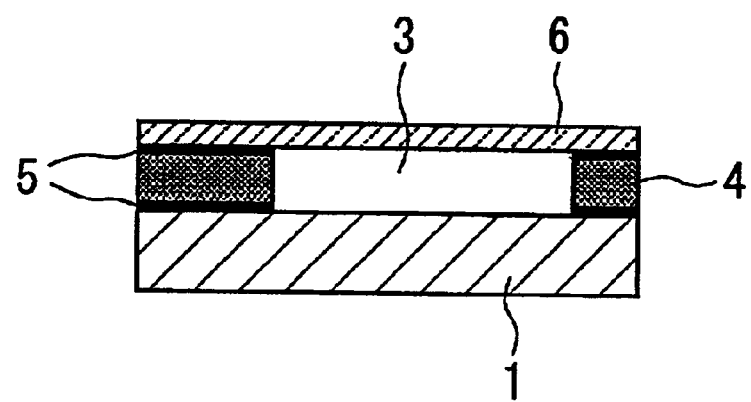
FIG. 5 is a sectional view of the embodiment shown in FIG. 4.

Some embodiments according to the invention will now be described. FIGS. 4 and 5 are a top view and a sectional view, respectively, showing an embodiment of the solid-state image pickup apparatus according to the invention. Referring to these figures, denoted by numeral 1 is a solid-state image pickup device chip; an epoxy-type resin sheet 4 having opening portion 3 only at the portion corresponding to a light-receiving portion 2 of the solid-state image pickup device chip 1 is adhered to the solid-state image pickup device chip 1 by means of an adhesive 5.

A solid-state image pickup apparatus is then constructed by adhering a transparent member 6 onto the epoxy-type resin sheet 4 by means of adhesive 5. In this construction, therefore, the epoxy-type resin sheet 4 becomes a frame portion and the transparent member 6 becomes a flat-plate portion in forming a hermetic seal portion. It should be noted that, in FIG. 4, denoted by numeral 7a, 7b are peripheral circuit portions for the light-receiving portion 2 of the solid-state image pickup device chip 1.

Here, opening 3 of epoxy-type resin sheet 4, i.e., a portion to be hermetically sealed is extended only over the light receiving portion 2 of solid-state image pickup device 1. It is however also possible to provide the hermetic seal portion for the entire solid-state image pickup device chip including the peripheral circuit portions 7a, 7b (excluding peripheral edge portions). A hole on the epoxy-type resin sheet 4 must be provided in advance for the portion corresponding to the region to be hermetically sealed. The transparent member 6 capable of becoming the flat-plate portion is preferably of glass, quartz, sapphire, transparent resin or the like. An epoxy- or silicone-type resin is preferably used for the gluing between the epoxy-type resin sheet 4 capable of becoming a frame portion and the solid-state image pickup device chip 1 and the transparent member 6 capable of becoming a flat-plate portion.

Figure 6:
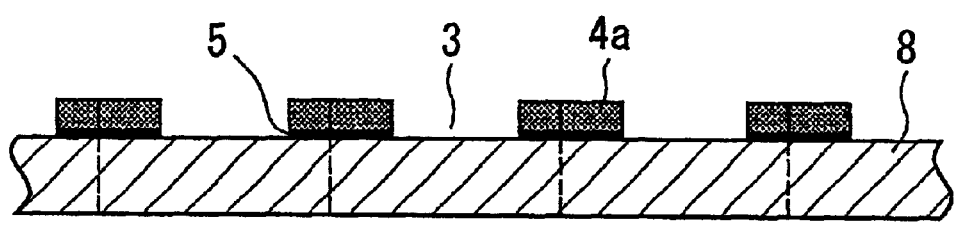
FIG. 6 shows fabrication process to explain an example of fabricating method of solid-state image pickup apparatus according to the invention.
Figure 7:
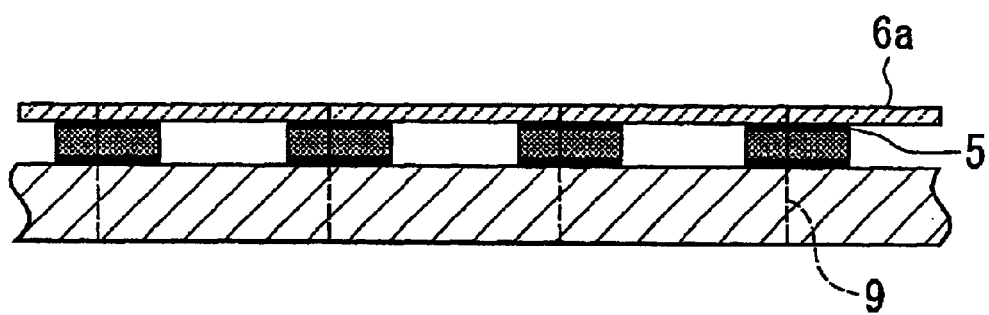
FIG. 7 shows fabrication process continued from the fabrication process shown in FIG. 6.

The fabricating method of a solid-state image pickup apparatus having such construction is very simple and only a summary of the processing steps thereof will be described below. First, as shown in FIG. 6, adhered by means of adhesive 5 onto wafer 8 having a large number of solid-state image pickup device chips formed thereon is an epoxy-type resin sheet 4a extended over the entire wafer and having previously provided openings 3 at the portions corresponding to desired region of respective solid-state image pickup device chips. Subsequently, as shown in FIG. 7, a transparent member 6a such as of glass capable of becoming flat-plate portion is integrally adhered to the entire wafer by means of adhesive 5 for the entire surface on the resin sheet 4a. Lastly, a solid-state image pickup device chip having a hermetic seal portion as shown in FIG. 7 is completed by means of dicing along scribed lines 9 as shown in FIG. 7.

Here, micro-lens or color filter for example may be formed on-chip or be formed by bonding or the like on the solid-state image pickup device chip. Further, the alignment mark at the time of fabricating solid-state image pickup device chip wafer can be used for the adhering of resin sheet 4 to wafer 8 and of transparent member 6a capable of becoming flat-plate portion to the resin sheet 4a. Since an accurate registration becomes possible, a hermetic seal portion can be formed precisely on the solid-state image pickup device chip.

It should be noted that, in this embodiment, an adhesive is used for the adhering of the epoxy-type resin sheet capable of becoming frame portion to the wafer and for the adhering of the transparent member capable of becoming flat-plate portion to the epoxy-type resin sheet. If an adhesive property is previously imparted to the epoxy-type resin sheet, however, the adhesive becomes unnecessary and the solid-state image pickup device chip, the resin sheet capable of becoming frame portion and the transparent member capable of becoming flat-plate portion can be readily adhered to each other. Accordingly, it becomes possible to more readily form the hermetic seal portion. As the epoxy-type resin sheet having an adhesive property, there is one available on the market in the form of a sheet with an epoxy resin applied on the both surface of a glass fiber layer thereof so that it becomes capable of adhering when heat and pressure are applied. Such resin sheet can be used.

Further, by using an epoxy-type resin sheet colored for example in black so as to shield light, the resin sheet capable of becoming the frame portion of the hermetic seal portion serves as a shield from light. It is thereby possible to shield unnecessary rays of light impinging on the solid-state image pickup device chip. Accordingly, an adverse effect for example due to stray light or reflection on the solid-state image pickup device chip can be prevented.

Figure 8:
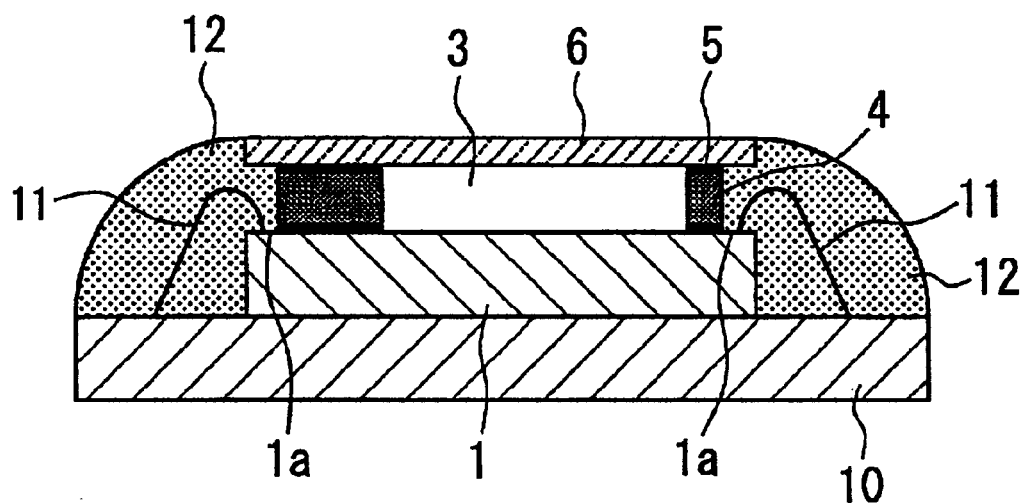
FIG. 8 shows an example of packaging of solid-state image pickup apparatus according to an embodiment of the invention.

A description will now be given with respect to packaging of the solid-state image pickup apparatus constructed as the above and the manner of bringing out electrodes from pad portion thereof. FIG. 8 shows an example of packaging. The solid-state image pickup device chip 1 is die-bonded to package or substrate 10. Packaging is achieved by using bonding wire 11 to provide predetermined connections between a pad portion 1a of solid-state image pickup device chip 1 and the package or substrate 10. Though this construction suffices as it is, the peripheral portion including the bonding wire connecting portion other than the hermetic seal portion may also be sealed as shown in the figure by means of sealing resin 12. Provided that, in this construction, the epoxy-type resin sheet 4 capable of becoming the frame portion of hermetic seal portion must be formed with excluding pad portion 1a of the solid-state image pickup device chip 1. Here, as the technique for removing resin sheet at the pad portion, a photosensitive epoxy resin sheet can be used so that it be readily removed for example by means of etching by patterning it based on ordinary photolithography after the adhering of the resin sheet onto the wafer as shown in FIG. 6.

Figure 9:
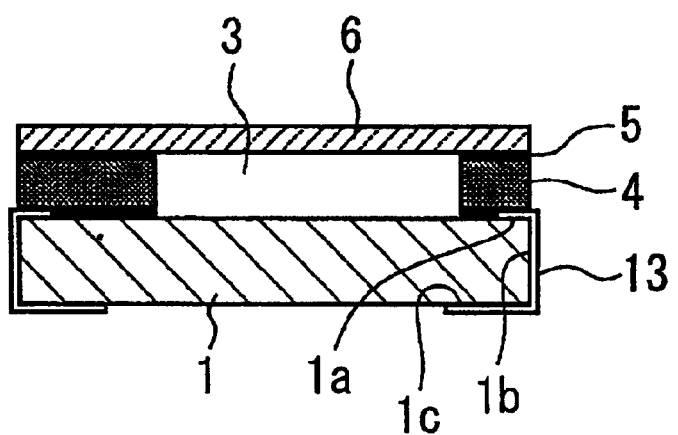
FIG. 9 shows an example of the manner of bringing an electrode out from pad portion of the solid-state image pickup apparatus according to an embodiment of the invention.

FIG. 9 shows an example of bringing out electrodes from pad portion. A wiring region 13 is formed from pad portion 1a to a chip side surface 1b or from the pad portion 1a to a reverse surface 1c on the solid-state image pickup device chip 1 through the chip side surface 1b. It is furthermore possible to provide a separate electrode pad on the reverse surface wiring region so as to be connected to a board or the like by means of a bump or the like. If such wiring region 13 is formed, it is not necessary to remove the portion of pad of the resin sheet 4 capable of becoming frame portion of the hermetic seal portion. It suffices to form a resin sheet over the pad portion so that the light-receiving area or entire chip is hermetically sealed. Alternatively, an external lead (not shown) for example may be connected to the wiring region 13 on the chip side surface 1b so as to achieve an electrical connection with an external terminal.

By using the structure as shown in FIG. 9, packaging becomes unnecessary and the solid-state image pickup device chip can be directly mounted on various circuit boards such as a circuit board having a signal processing circuit formed thereon. Further, by the wiring region or electrode pad provided on the reverse surface of the solid-state image pickup device chip, it can be readily bonded or adhered to a semiconductor chip having a signal generating circuit or signal processing circuit thereon. Accordingly, it becomes possible to readily make a laminated solid-state image pickup apparatus where a solid-state image pickup device chip, signal processing circuit, etc., are integrally formed. A further downsizing thus can be achieved of the solid-state image pickup apparatus including peripheral circuits.

It should be noted that the packaging in FIG. 8 and the manner of bringing out electrode from pad portion in FIG. 9 have been shown by way of examples only. The present invention is not limited to these and various modifications thereof are naturally possible without departing from the spirit of the invention.

As has been described by way of the above embodiments, according to the invention, a solid-state image pickup apparatus having a hermetic seal portion can be achieved as capable of downsizing by a simple construction. Further, it is possible according to the invention to provide a solid-state image pickup apparatus having a hermetic seal portion with a simple construction without requiring an adhesive. Further, it is possible according to the invention to provide a solid-state image pickup apparatus having a hermetic seal portion capable of preventing an adverse effect due to stray light or reflection on solid-state image pickup device chip without providing a separate member for shielding light. Further, it is possible according to the invention to provide a solid-state image pickup apparatus having a hermetic seal portion in which an optimum electrical connection structure can be obtained between solid-state image pickup device chip and an external terminal. Further, it is possible according to the invention to readily fabricate a solid-state image pickup apparatus having a hermetic seal portion precisely on solid-state image pickup device chip, since hermetic seal portions are formed at once over the respective solid-state image pickup device chips in a wafer.

What is claimed is:

1. A fabricating method of a solid-state image pickup apparatus including a solid-state image pickup device chip and a hermetic seal portion provided over the solid-state image pickup device chip having a flat-plate portion formed of a transparent member and a frame portion adhered to a lower surface edge portion of the flat-plate portion comprising the steps of:

for an entire wafer having a large number of said solid-state image pickup device chips formed thereon, integrally forming said hermetic seal portion having said flat-plate portion made of said transparent member and said frame portion formed of an epoxy-type resin sheet adhered to said lower surface edge portion of the flat-plate portion correspondingly to respective solid-state image pickup device chips; and separating the wafer having the integrally formed hermetic seal portion thereon into said solid-state image pickup device chips each having an individual hermetic seal portion;

creating a wiring region formed from an electrode pad on each of said solid-state image pickup device chips to a side surface of said each solid-state image pickup device chip or from the electrode pad to a reverse surface thereof through the side surface so that an external terminal can be electrically connected to the wiring region and having said hermetic seal portion formed by adhering said frame portion directly to the each solid-state image pickup device chip itself.

2. A fabricating method of a solid-state image pickup apparatus including a solid-state image pickup device chip and a hermetic seal portion provided over the solid-state image pickup device chip having a flat-plate portion formed of a transparent member and a frame portion adhered to a lower surface edge portion of the flat-plate portion comprising the steps of:

for an entire wafer having a large number of said solid-state image pickup device chips formed thereon, integrally forming said hermetic seal portion having said flat-plate portion made of said transparent member and said frame portion formed of an epoxy-type resin sheet adhered directly onto said solid-state image pickup device chip and to said lower surface edge portion of the flat-plate portion correspondingly to respective solid-state image pickup device chips; and separating the wafer having the integrally formed hermetic seal portion thereon into said solid-state image pickup device chips each having an individual hermetic seal portion;

wherein a space is formed between said chip and said flat-plate portion.

* * * * *